(12) United States Patent
Augustino et al.

(10) Patent No.: US 7,767,028 B2
(45) Date of Patent: Aug. 3, 2010

(54) CLEANING HARDWARE KIT FOR COMPOSITE SHOWERHEAD ELECTRODE ASSEMBLIES FOR PLASMA PROCESSING APPARATUSES

(75) Inventors: Jason Augustino, Fremont, CA (US); Charles Rising, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 334 days.

(21) Appl. No.: 12/073,651

(22) Filed: Mar. 7, 2008

(65) Prior Publication Data

US 2008/0223401 A1 Sep. 18, 2008

Related U.S. Application Data

(60) Provisional application No. 60/906,808, filed on Mar. 14, 2007.

(51) Int. Cl.
| | |
|---|---|
| B08B 7/00 | (2006.01) |
| B08B 7/04 | (2006.01) |
| B08B 3/04 | (2006.01) |
| B08B 9/023 | (2006.01) |
| B08B 9/027 | (2006.01) |

(52) U.S. Cl. ............................ 134/28; 134/26; 134/30; 134/32; 134/34; 134/37; 134/2; 134/3; 134/22.12; 134/22.18; 134/61; 134/84; 134/85; 134/94.1; 134/95.1; 134/95.2; 134/137; 134/166 R; 134/170; 134/182; 134/183

(58) Field of Classification Search ............... 134/2, 134/3, 26, 28, 30, 32, 34, 37, 22.12, 22.18, 134/61, 84, 85, 94.1, 95.1, 95.2, 137, 166 R, 134/170, 182, 183

See application file for complete search history.

(56) References Cited

U.S. PATENT DOCUMENTS 6,148,765 A 11/2000 Lilleland et al.

(Continued)

FOREIGN PATENT DOCUMENTS

JP 2003-243358 A 8/2003

(Continued)

OTHER PUBLICATIONS

International Search Report and Written Opinion dated Aug. 7, 2008 for PCT/US2008/003223.

*Primary Examiner*—Alexander Markoff
(74) *Attorney, Agent, or Firm*—Buchanan Ingersoll & Rooney PC

(57) ABSTRACT

Apparatus to clean silicon electrode assembly surfaces which controls or eliminates possible chemical attack of electrode assembly bonding materials, and eliminates direct handling contact with the parts to be cleaned during acid treatment, spray rinse, blow dry, bake and bagging. Aspects of the apparatus include a kit including an electrode carrier to hold an electrode assembly, a treatment stand to allow access to the electrode assembly, a spider plate to clamp the electrode assembly in the electrode carrier, a nitrogen purge plate to supply nitrogen gas to the backside of the electrode assembly during acid cleaning of the electrode, a water rinse plate to supply water to the electrode face, a blow dry plate to supply nitrogen to dry the electrode assembly and a bake stand to support the electrode assembly during a bake before placing the clean electrode assembly in a bag.

20 Claims, 11 Drawing Sheets

U.S. PATENT DOCUMENTS

| | | |
|---|---|---|
| 6,194,322 B1 | 2/2001 | Lilleland et al. |
| 6,376,385 B2 | 4/2002 | Lilleland et al. |
| 7,045,020 B2 | 5/2006 | Rhatnagar et al. |
| 7,052,553 B1 | 5/2006 | Shih et al. |
| 2006/0138081 A1 | 6/2006 | Huang et al. |
| 2006/0141787 A1 | 6/2006 | Ren et al. |
| 2006/0141802 A1 | 6/2006 | Shih et al. |
| 2008/0092920 A1* | 4/2008 | Shih et al. ................ 134/1 |

FOREIGN PATENT DOCUMENTS

| | | |
|---|---|---|
| JP | 2003-273078 A | 9/2003 |

* cited by examiner

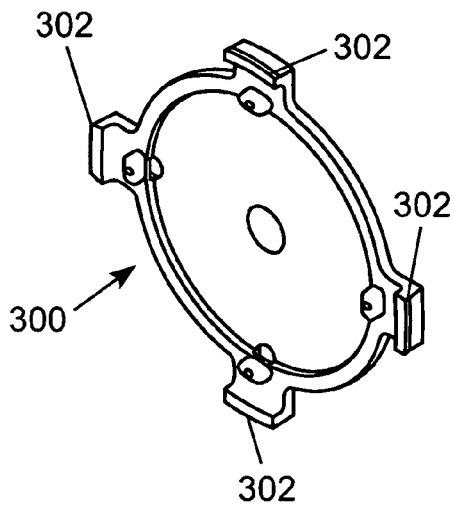
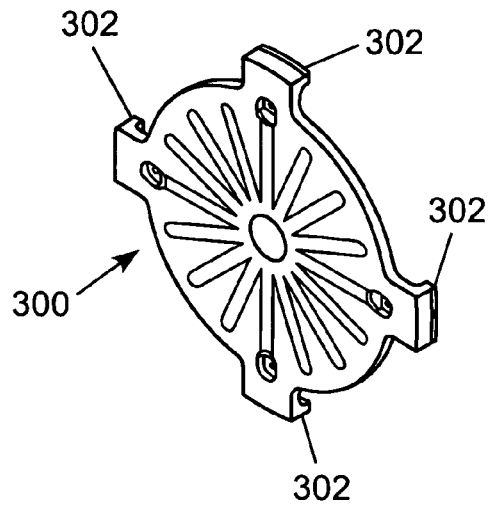
FIG. 5A    FIG. 5B
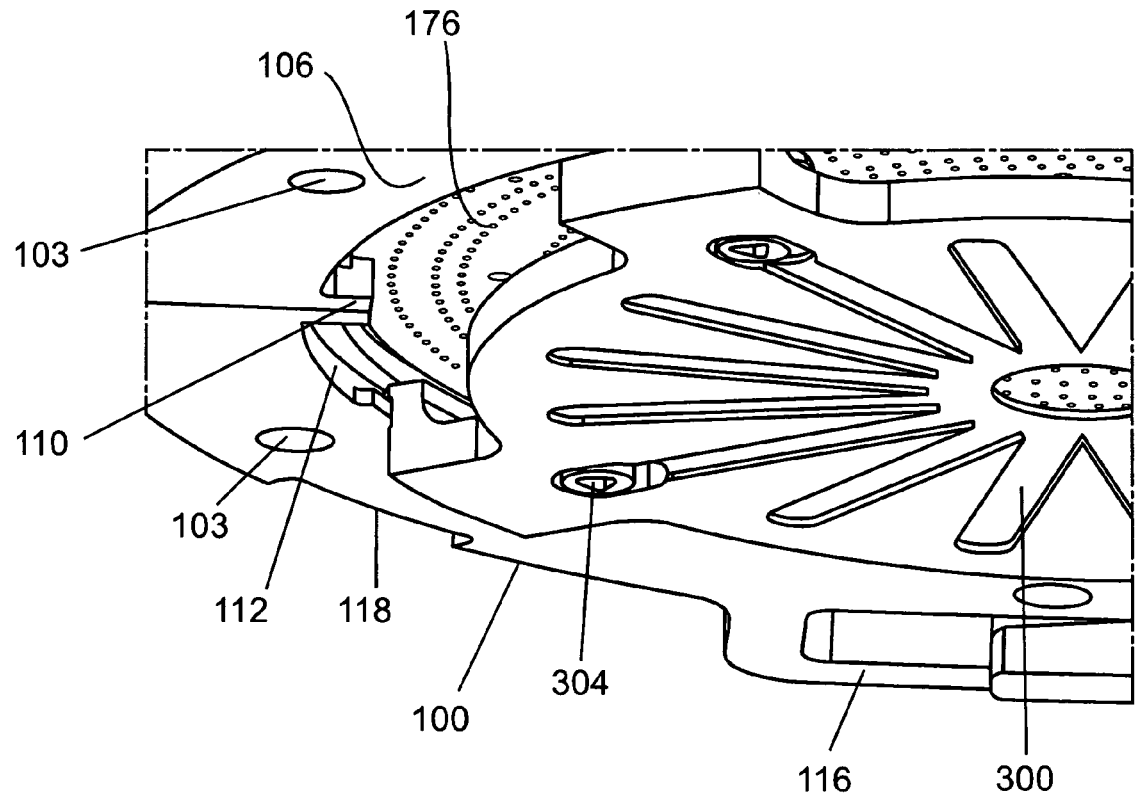
FIG. 6

CLEANING HARDWARE KIT FOR COMPOSITE SHOWERHEAD ELECTRODE ASSEMBLIES FOR PLASMA PROCESSING APPARATUSES

CROSS REFERENCE TO RELATED APPLICATION

This application claims priority under 35 USC §119 to U.S. Provisional Application No. 60/906,808 entitled CLEANING HARDWARE KIT FOR COMPOSITE SHOWERHEAD ELECTRODE ASSEMBLIES FOR PLASMA PROCESSING APPARATUSES and filed on Mar. 14, 2007, the entire content of which is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and bottom electrodes. An electric field is established between the electrodes to excite a process gas into the plasma state to process substrates in the reaction chamber.

SUMMARY

According to an aspect of the present invention, an apparatus and method for cleaning a composite showerhead electrode for a plasma processing apparatus are provided.

One embodiment of a cleaning kit useful for cleaning a composite showerhead electrode including a silicon plate bonded to an aluminum backing plate, of a plasma reaction chamber, comprises an electrode carrier which supports the composite showerhead electrode with the silicon plate facing up; a treatment stand having a base and a plurality of support posts which engage the electrode carrier and support the electrode carrier; a first plate which attaches to a first side of the electrode carrier and one or more attachment members which engage the aluminum plate to support the composite showerhead electrode with the silicon plate exposed for cleaning thereof; a second plate which attaches to the first side of the electrode carrier such that the first plate is located in a space between the second plate and the composite showerhead electrode, the second plate including a seal which engages the first side of the electrode carrier and a gas inlet through which gas can be introduced under pressure to flow into gas holes in the aluminum plate and exit corresponding gas holes in the silicon plate, the second plate allowing gas to be flowed through the gas holes during acid cleaning of the exposed surface of the silicon plate; a third plate which attaches to a second side of the electrode carrier with the silicon plate facing up, the third plate including a seal which engages the electrode carrier and a water inlet through which water can be introduced under pressure to flow into gas holes in the silicon plate and exit corresponding gas holes in the aluminum plate, the third plate allowing low pressure water to be flushed through the gas holes for water rinsing the composite showerhead electrode after the cleaning the silicon surface; a drying stand having a base frame and a plurality of posts, the base frame supporting the electrode carrier and the composite showerhead electrode such that the electrode carrier can be removed from the composite showerhead electrode without manually touching the composite showerhead electrode; and a fourth plate including a seal which engages the base frame and a gas inlet through which gas can be introduced under pressure to flow into gas holes in the silicon plate and exit corresponding gas holes in the aluminum plate, the fourth plate allowing gas to dry the composite showerhead electrode after a water rinsing step.

In another embodiment, a method of cleaning a composite showerhead electrode assembly for a plasma processing apparatus using the cleaning kit described above includes supporting the composite showerhead electrode in the electrode carrier, placing the electrode carrier on the treatment stand, attaching the first plate, attaching the second plate, introducing gas into the gas inlet in the second plate while acid cleaning the exposed surface of the silicon plate, removing the first and second plates, attaching the third plate and introducing water through the water inlet in the third plate to rinse the gas holes, removing the third plate and placing the electrode carrier on the base frame, removing the electrode carrier from the composite showerhead electrode, attaching the fourth plate to the posts of the drying stand, introducing gas into the gas inlet of the fourth plate to dry the composite showerhead electrode, removing the fourth plate, and placing the composite showerhead electrode in an oven while supported on the base frame.

BRIEF DESCRIPTION OF THE DRAWINGS

FIGS. 5A and 5B show two detailed views of the spider plate.

FIG. 6 shows details of the spider plate shown in FIG. 4 installed in the electrode carrier.

DETAILED DESCRIPTION

Figure 1:
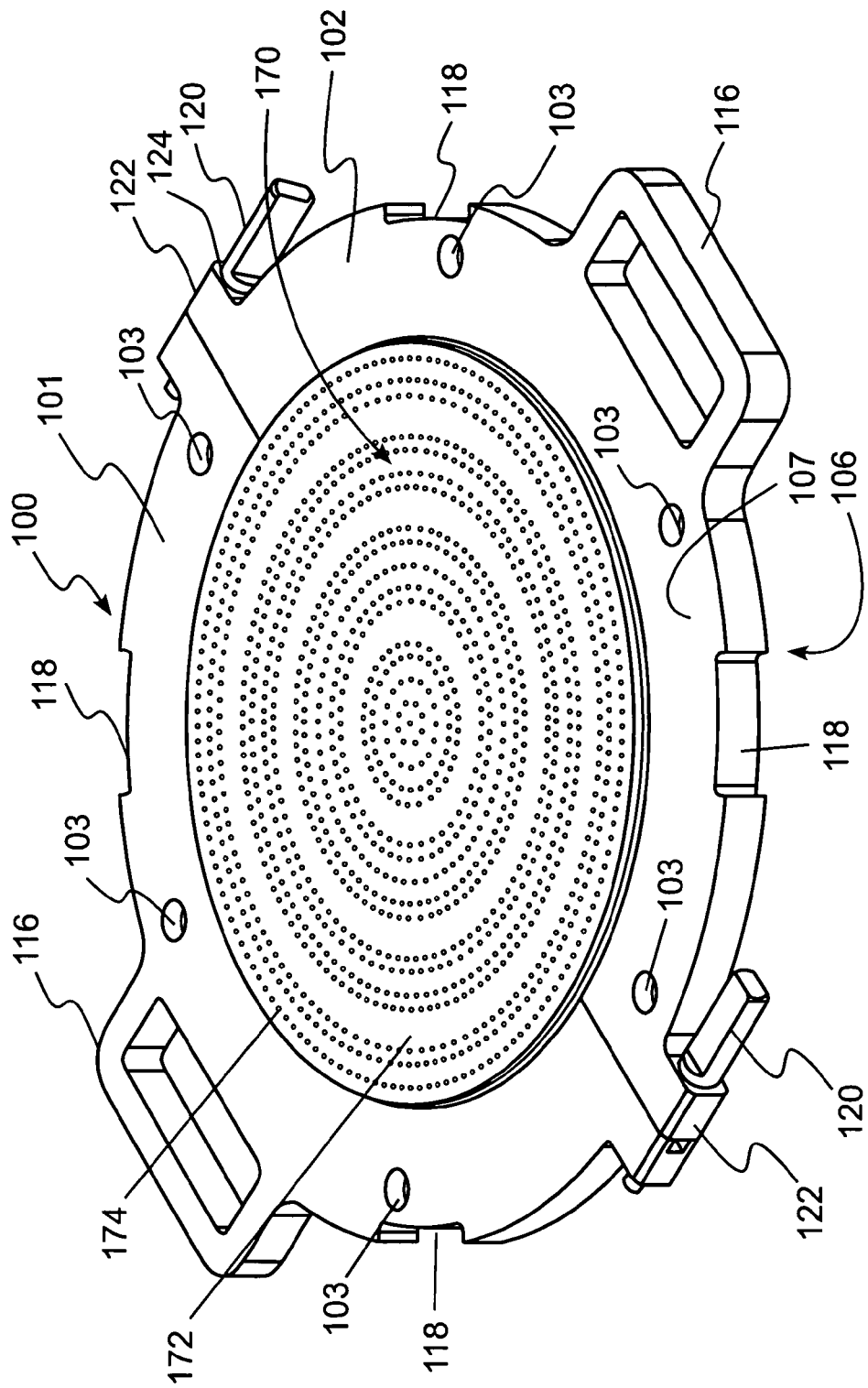
FIG. 1 shows an embodiment of an electrode carrier to hold a composite showerhead electrode.

Apparatuses to clean silicon electrode assembly surfaces which controls or eliminates possible chemical attack of electrode assembly bonding materials and eliminates direct handling contact with the parts to be cleaned during acid treatment, spray rinse, blow dry, bake and bagging are provided.

The electrode assemblies can be new, used or reconditioned. Methods of cleaning silicon electrode assemblies are also provided.

During the plasma processing of semiconductor substrates, it is desirable to minimize the number of particles introduced into the plasma processing chamber by chamber components. Such particles, referred to as "adders," can deposit on the substrates and consequently reduce process yields.

Plasma processing chambers can include an upper electrode assembly and a substrate support facing the upper electrode assembly and having a lower electrode. The upper electrode can be a showerhead electrode assembly, for example. Showerhead electrode assemblies can be a source of particles. Such assemblies can include an electrode plate and a backing member, such as a backing plate, secured to the electrode plate. The electrode plate and backing plate can have gas passages through which process gas is introduced into the plasma processing chamber. The backing plate can be made of aluminum, for example. The electrode plate can be made of silicon, for example. The electrode plate can be bonded to the backing plate by adhesive such as an elastomeric bonding material.

The electrode plate and/or the backing plate can be a source of particles. The particles can originate from different sources during the manufacturing of the electrode assemblies. For example, the particles can result from manufacturing of the aluminum backing plate, pre-bonding contamination of the electrode plate and/or backing plate, the bonding process, handling and insufficient cleaning, and packaging. The particles can be inorganic (e.g., graphite or metals) or organic substances.

Control of particulate contamination on the surfaces of semiconductor wafers during the fabrication of integrated circuits is essential in achieving reliable devices and obtaining a high yield. The presence of particles on a wafer surface can locally disrupt pattern transfer during photolithography and etching steps. As a result, these particles can introduce defects into critical features, including gate structures, intermetal dielectric layers or metallic interconnect lines, and cause the malfunction or failure of integrated circuit components.

Enhanced cleaning methods are provided that can significantly reduce the number of particles on upper electrode assemblies, such as showerhead electrode assemblies.

Embodiments of the apparatuses can be used to clean new, used or refurbished backing plates and electrode assemblies. As described herein, "new" backing plates and electrode assemblies have not been used in a plasma processing chamber for processing semiconductor substrates; "used" backing plates and electrode assemblies have been used in a plasma processing chamber for processing semiconductor substrates; and "refurbished" backing plates and electrode assemblies have been used in a plasma processing chamber for processing semiconductor substrates, and the electrode plate has subsequently been treated, e.g., polished, to remove undesirable surface contamination and/or surface structure, e.g., black silicon, or uneven surface regions, formed on the bottom (plasma-exposed) surface of the silicon electrode plate during plasma processing. The entire bottom surface of the electrode plate, or only a portion of the bottom surface can be polished, depending on its condition. Silicon electrode plates may be refurbished one or more times.

The electrode plate of the electrode assembly can be composed, for example, of silicon (preferably single-crystal silicon) or silicon carbide. The electrode plate is typically circular, and can have a diameter of 200 mm, 300 mm, or even larger, for example. The electrode plate can have any suitable thickness, such as from about 0.25 in to about 0.5 in. The backing plate can be composed, for example, of graphite or aluminum. The backing plate is typically circular and sized to correspond with the shape and size of the electrode plate. The electrode assembly can include an outer electrode, such as an outer ring, surrounding the inner composite showerhead electrode, and an outer backing member, such as an outer backing ring, surrounding the backing plate. The kit described herein is useful for cleaning the inner composite showerhead electrode.

Used silicon electrode assemblies exhibit etch rate drop and etch uniformity drift after a large number of RF hours (time in hours during which radio frequency power is used to generate the plasma) are run using the electrode assemblies. The decline of etch performance results from changes in the morphology of the silicon surface of the electrode assemblies as well as contamination of the silicon surface of the electrode assemblies, both of which are a product of the dielectric etch process.

Silicon surfaces of used electrode assemblies can be polished to remove black silicon and other metal contamination therefrom. Metallic contaminants can be efficiently removed from silicon surfaces of such electrode assemblies without discoloring the silicon surfaces by wiping with an acidic solution, which reduces the risk of damage to electrode assembly bonding materials. Accordingly, process window etch rate and etch uniformity can be restored to acceptable levels by cleaning the electrode assemblies.

Dielectric etch systems (e.g., Lam 2300 Exelan® and Lam Exelan® HPT) may contain silicon showerhead electrode assemblies containing gas outlets. As disclosed in commonly owned U.S. Pat. No. 6,376,385, which is incorporated herein by reference, an electrode assembly for a plasma reaction chamber wherein processing of a semiconductor substrate such as a single wafer can be carried out may include a support member such as a graphite backing ring or member, an electrode such as a silicon showerhead electrode in the form of a circular disk of uniform thickness and an elastomeric joint between the support member and the electrode. The elastomeric joint allows movement between the support member and the electrode to compensate for thermal expansion as a result of temperature cycling of the electrode assembly. The elastomeric joint can include an electrically and/or thermally conductive filler and the elastomer can be a catalyst-cured polymer which is stable at high temperatures. For example, the elastomer bonding material may comprise silicon polymer and aluminum alloy powder filler. In order to avoid contacting the acidic solution with the bonding material of the electrode assembly, which may damage the bonding material, the silicon surface of the used electrode assembly is preferably wiped with the acidic solution.

Additionally, an electrode assembly may comprise an outer electrode ring or member surrounding an inner electrode and optionally separated therefrom by a ring of dielectric material. The outer electrode member is useful for extending the electrode to process larger wafers, such as 300 mm wafers. The silicon surface of the outer electrode member may comprise a flat surface and a beveled outer edge. Similar to the inner electrode, the outer electrode member is preferably provided with a backing member, e.g., the outer ring may comprise an electrically grounded ring to which the outer electrode member may be elastomer bonded. The backing member of the inner electrode and/or outer electrode member may have mounting holes for mounting in a capacitively coupled plasma processing tool. Both the inner electrode and outer electrode member are preferably comprised of single crystalline silicon, in order to minimize electrode assembly contaminants. The outer electrode member may be comprised of a number of segments (e.g., six segments of single crystalline silicon, arranged in an annular configuration, each of the segments being bonded (e.g., elastomer bonded) to a backing member. Further, adjacent segments in the annular configuration may be overlapping, with gaps or joints between the adjacent segments.

Silicon electrode assemblies used in dielectric etch tools deteriorate after a large number of RF hours are run using the electrode assemblies, in part due to the formation of black silicon. "Black silicon" can form on a plasma exposed silicon surface as a result of the surface being micro-masked by contaminants deposited on the surface during plasma processing operations. Specific plasma processing conditions affected by the formation of black silicon include high nitrogen and low oxygen and CF concentrations at moderate RF power, as used during etching of low K vias. The micro-masked surface regions can be on the scale of from about 10 nm to about 10 microns. While not wishing to be bound to any particular theory, black silicon formation on the plasma-exposed surface of a silicon electrode (or other silicon part) is believed to occur as a result of non-contiguous polymer deposition on the silicon electrode during plasma processing operations.

A non-contiguous polymer deposit can form on the plasma-exposed surface, e.g., the bottom surface of a silicon upper electrode, during a main etching step for etching a dielectric material on a semiconductor substrate, such as silicon oxide or a low-k dielectric material layer. The polymer deposits typically form three-dimensional, island-like formations that selectively protect the underlying surface from etching. Once needle-like formations are formed, polymer deposits then form preferentially on the needle tips, thereby accelerating the micro-masking mechanism and black silicon propagation during the main etching step for successive substrates. The non-uniform, anisotropic etching of the micro-masked surface region(s) results in the formation of closely-spaced, needle-like or rod-like features on the surface. These features can prevent light from reflecting from the modified regions of the silicon surface, which causes those regions to have a black appearance. The needle-like micro features are closely spaced and can typically have a length of from about 10 nm (0.01 µm) to about 50,000 nm (50 µm) (and in some instances can have a length as high as about 1 mm or even greater), and can typically have a width of from about 10 nm to about 50 µm.

Silicon surfaces of electrode assemblies affected by black silicon may be recovered by polishing. Prior to polishing, the electrode assembly may be pre-cleaned to remove foreign materials. Such pre-cleaning may include $CO_2$ snow blasting, which involves directing a stream of small flakes of dry ice (e.g., generated by expanding liquid $CO_2$ to atmospheric pressure through a nozzle, thereby forming soft flakes of $CO_2$) at the surface being treated, so that the flakes hit small particulate contaminants less than one micron in size on the substrate, then vaporize via sublimation, lifting the contaminants from the surface. The contaminants and the $CO_2$ gas then typically are passed through a filter, such as a high efficiency particulate air (HEPA) filter, where the contaminants are collected and the gas is released. An example of a suitable snow-generating apparatus is Snow Gun-II™, commercially available from Vatran Systems, Inc. (Chula Vista, Calif.). Prior to polishing, the electrode assembly may be cleaned with acetone and/or isopropyl alcohol. For example, the electrode assembly may be immersed in acetone for 30 minutes and wiped to remove organic stains or deposits.

Polishing comprises grinding a surface of the electrode assembly on a lathe using a grinding wheel with appropriate roughness grade number and polishing the electrode assembly surface to a desired finish (e.g., 8 µ-inches) using another wheel. Preferably, the silicon surface is polished under constant running water, in order to remove dirt and keep the electrode assembly wet. When water is added, a slurry may be generated during the polishing, which is to be cleaned from the electrode assembly surface. The electrode assembly may be polished first using an ErgoSCRUB™ and ScrubDISK. The polishing procedure (i.e., the selection and sequence of the polishing paper used), depends on the degree of damage of the silicon surface of the electrode assembly.

If severe pitting or damage is observed on the silicon electrode assembly, polishing can begin with, for example, a 140 or 160 grit diamond polishing disk until a uniform flat surface is achieved. Subsequent polishing can be with, for example, 220, 280, 360, 800, and/or 1350 grit diamond polishing disks. If minor pitting or damage is observed on the silicon electrode assembly, polishing can begin with, for example, a 280 grit diamond polishing disk until a uniform flat surface is achieved. Subsequent polishing can be with, for example, 360, 800, and/or 1350 grit diamond polishing disks.

During polishing, the electrode assembly is attached to a turntable, with a rotation speed of preferably about 40-160 rpm. A uniform, but not strong, force is preferably applied during polishing, as a strong force may cause damage to the silicon surface or bonding area of the electrode assembly. Accordingly, the polishing process may take a significant amount of time, depending on the degree of pitting or damage on the electrode assembly. The shape and angle of an outer electrode ring or member (e.g., the interface between the flat surface and the beveled outer edge) is preferably maintained during polishing. In order to minimize particles trapped inside gas outlets and within joints of electrode assemblies, a deionized water gun may be used to remove particles generated during polishing from the gas outlets and joints whenever changing polishing disks and UltraSOLV® ScrubPADs may be used to remove particles from the polishing disks.

Following polishing, the electrode assembly is preferably rinsed with deionized water and blown dry. The surface roughness of the electrode assembly may be measured using, for example, a Surfscan system. The surface roughness of the electrode assembly is preferably approximately 8 µ-inches or less.

The electrode assembly is preferably immersed in deionized water at 80° C. for 1 hour in order to loosen particles that may be trapped in gas outlets and joints in the electrode assembly. The electrode assembly may be ultrasonically cleaned for 30 minutes in deionized water at about 60° C., to remove particles from the surface of the electrode assembly. The electrode assembly may be moved up and down within the ultrasonic bath during the ultrasonic cleaning in order to help remove trapped particles.

The electrode assembly, including gas outlets and joints or mounting holes of the electrode assembly, may be cleaned using a nitrogen/deionized water gun at a pressure of less than or equal to 50 psi. Special handling may be needed to avoid damaging or impacting a graphite backing member of the electrode assembly, as the graphite surface of a used electrode assembly might have a loose surface structure. Cleanroom paper, nylon wire, or white thread may be used to check particle removal quality, for example, from gas outlets and joints of the electrode assembly. The electrode assembly may be dried using a nitrogen gun at a pressure less than or equal to 50 psi.

Following polishing, the electrode assembly may be cleaned with a solution of deionized water and isopropyl alcohol, preferably ultrasonic, to remove soluble metal contaminants, such as, for example, sodium salts, potassium salts, and combinations thereof, as well as polymer deposition from electrode assemblies. A weakly acidic or near neutral solution, described in detail below, removes insoluble metal salts, such as, for example, calcium silicate, copper oxide, zinc oxide, titania, and combinations thereof. The acidic solution is removed from the electrode assembly using deionized water, ultrasonic preferred. Finally, the electrode assembly is preferably blown dry using filtered nitrogen gas and oven baked prior to final inspection and packaging.

The weakly acidic or near neutral solution for the removal of silicon surface metal contaminants may comprise: 0.01-5% $NH_4F$+5-30% $H_2O_2$+0.01-10% HAc+0-5% $NH_4Ac$+balance UPW. In another embodiment, the weakly acidic or near neutral solution may comprise: 0.01-2% $NH_4F$+10-20% $H_2O_2$+0.01-5% HAc+0-5% $NH_4Ac$+balance UPW. Additives, such as chelating agents, ethylenediaminetetraacetic acid (EDTA), and surfactants, can also be added to the cleaning solution to enhance the efficiency and chemical reaction rate.

Hydrolysis of ammonium fluoride ($NH_4F$) in the acidic solution generates hydrofluoric acid and ammonium hydroxide. Hydrofluoric acid helps etch the silicon surface. However, excess hydrofluoric acid is undesirable in cleaning elastomer bonded silicon electrode assemblies, as hydrofluoric acid may cause decomposition of silicon polymer. Ammonia, provided through solution balance with ammonium ions, is an excellent complexing agent that forms stable complex metal ions with many transition metals, such as, for example, copper and iron. Thus, the presence of ammonium helps improve metal removal efficiency.

Hydrogen peroxide ($H_2O_2$) is a strong oxidizer, which helps to remove not only organic contaminants, but also metal contaminants. As an oxidant, hydrogen peroxide can oxidize transition metals to higher chemical states to form soluble complexes with ammonia, as described above. Further, hydrogen peroxide can form chelating complexes with many metal ions to improve cleaning efficiency. Acetic acid (HAc) and ammonium acetate ($NH_4Ac$) serve as buffer solutions to maintain the pH of the solution as weakly acidic or near neutral. The ultra-pure deionized water (UPW) preferably has a resistivity of greater than $1.8\times10^7$ ohm/cm (18 mega-ohms/cm).

To further reduce the risk that the bonding material of the electrode assembly is chemically attacked by the acidic solution, metal contaminants are removed by contacting the silicon surface of the electrode assembly with the acidic solution, preferably by wiping, as opposed to soaking the electrode assembly in the acidic solution. Accidental contact of the acidic solution with the backing member or bonding area is thus avoided by contacting only the silicon surface of the electrode assembly with the acidic solution and by means of a cleaning kit that allows the silicon surface of the electrode assembly to be supported facing downward while the silicon surface is cleaned. With the silicon surface of the electrode assembly supported facing downward, excess acidic solution applied to the silicon surface can be collected after dripping off of the silicon surface, as opposed to flowing to the backing member or bonding area. The backing member and bonding area are further protected by flowing nitrogen gas ($N_2$) through the showerhead gas outlets from the backing plate side to the electrode plate side minimizing or eliminating acid traveling up the gas outlets by capillary action.

Additional measures to avoid accidental contact of the acidic solution with the backing member or bonding area include drying the electrode assembly after wiping using compressed nitrogen gas, blown from the backing member down to the silicon surface, and blowing any residual solution from the silicon surface. After wiping, the solution is removed from the electrode assembly by rinsing the electrode assembly with deionized water. The cleaning kit allows flushing the showerhead electrode with water through the gas outlets from the silicon electrode side to the backing plate side to avoid contaminants from the backing plate depositing on the silicon electrode. The composite electrode assembly is blow dried under nitrogen gas ($N_2$), baked and bagged utilizing a series of fixtures and stands of the cleaning kit to eliminate multiple contamination sources, achieve consistent and controlled part processing and reduce the risk of part damage during processing.

The cleaning kit, sized to the electrode assembly to be cleaned, has an electrode carrier which supports the composite showerhead electrode, eliminating direct human contact with the electrode to be cleaned. As illustrated in FIG. 1, an electrode carrier 100 supports a composite showerhead electrode 170 for cleaning. The electrode carrier 100 is generally flat, having a first surface (side) 106 and a second surface (side) 107. The electrode carrier 100 comprises two electrode carrier halves 101, 102 which substantially surround the composite electrode 170. The electrode carrier half 101 is joined to electrode carrier half 102 with captured thumb screws 120 through outwardly extending bosses 122. FIG. 1 shows the silicon electrode 172 side of the composite showerhead electrode 170 and the gas outlets 174 supported by the electrode carrier 100.

Figure 2A:
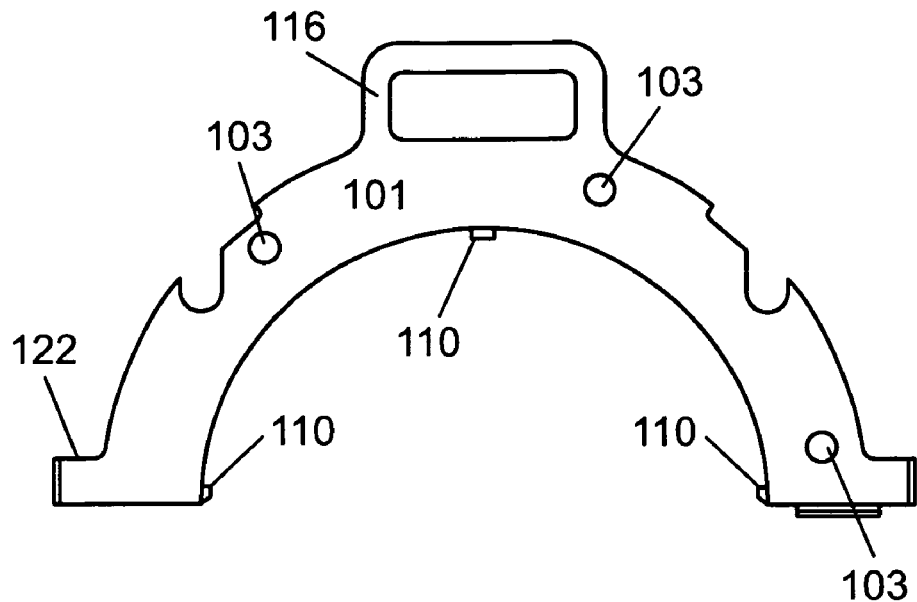
FIGS. 2A and 2B show detailed views of another embodiment of the electrode carrier.
Figure 2B:
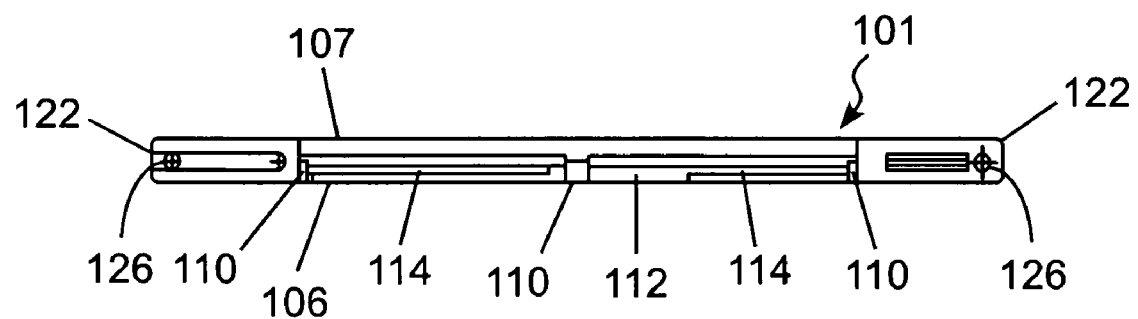
Figure 3:
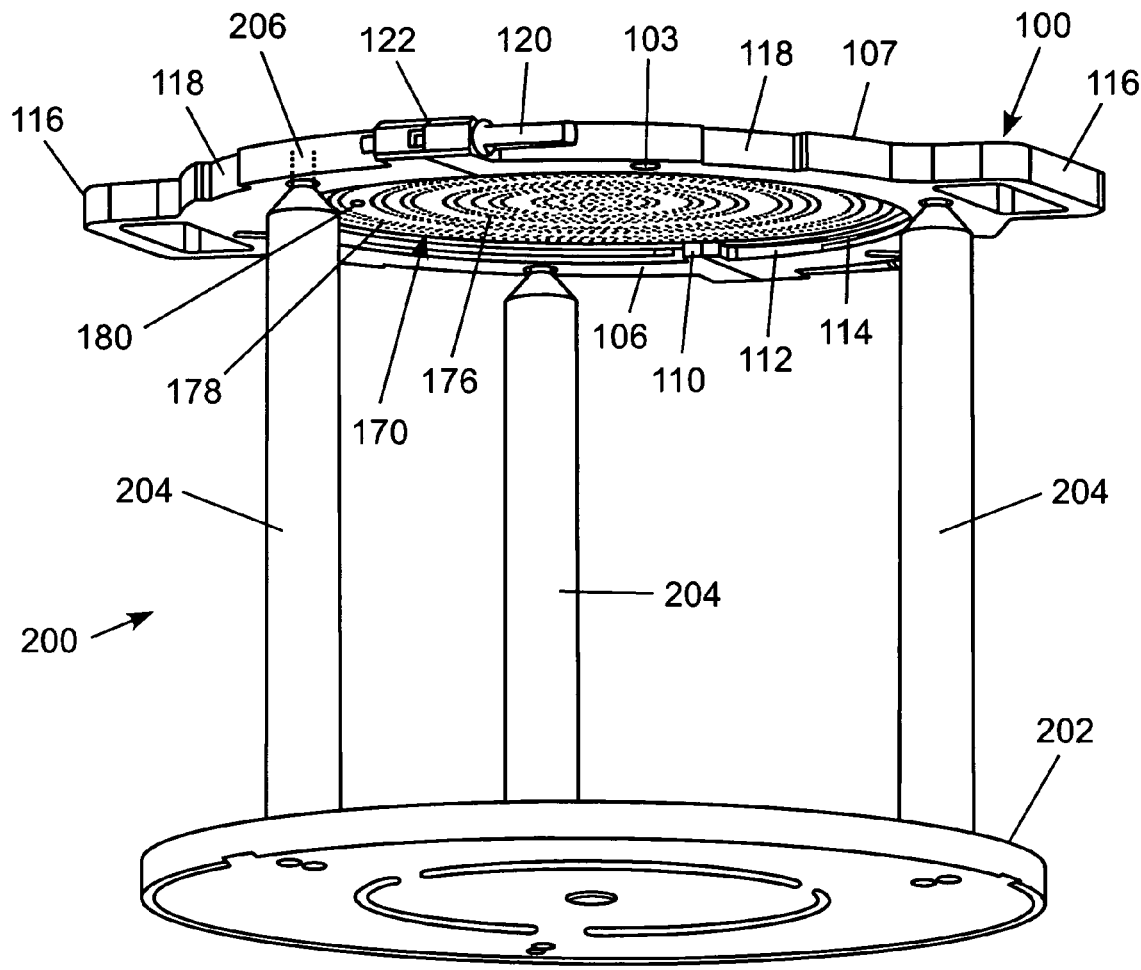
FIG. 3 shows the electrode carrier and electrode of FIG. 1 with an embodiment of a treatment stand.

The aluminum backing plate side 176 (see FIG. 3) of the composite showerhead electrode 170 rests on inwardly extending projections 110 shown in FIGS. 2A and 2B. The horizontally extending opening 124 in the boss 122 captures the thumb screw 120 (FIG. 1) and the threaded opening 126 that receives the thumbscrew 120 to secure the two electrode carrier halves 101, 102 together is shown in FIG. 2B. The opposing handles 116 allow manual lifting of the electrode carrier 100. FIG. 3 shows the aluminum backing plate side 176 of the composite showerhead electrode 170 resting on the inwardly extending projections 110 and the electrode carrier 100 supported on an acid treatment stand 200. The acid treatment stand 200 comprises a generally flat base 202 and three posts 204 extending vertically from the base 202. The electrode carrier 100 includes three or more holes 103 (e.g., 6 equally spaced holes allow the carrier to be oriented in various positions) to receive tips 206 of the posts 204 thereby securely holding the electrode carrier 100 in a stable manner. In an embodiment, the electrode carrier halves 101, 102 may be made from a chemically resistant material, such as polypropylene, which is chemically resistant to acids and the thumb screws 120 may be made from a chemically resistant material, such as polyetheretherketones (PEEK).

Figure 4:
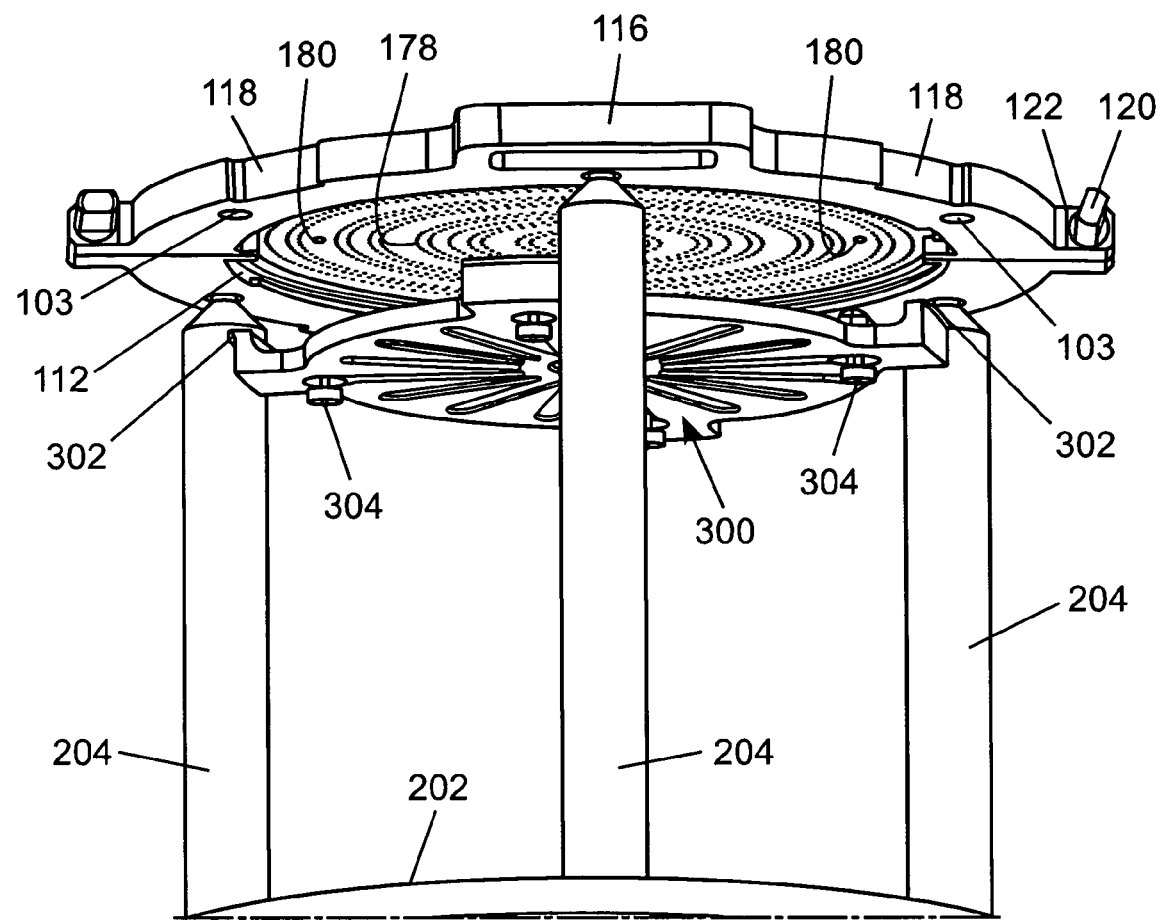
FIG. 4 shows an embodiment of a spider plate to retain the electrode on the carrier.

As shown in FIGS. 4, 5A and 5B, a first plate 300 (spider plate) includes four flanges 302 and four thumbscrews 304. There are four vertically extending slots 112 on an inner periphery of the first surface 106 of the electrode carrier 100 to receive the flanges 302 on the first plate 300. Circumferential grooves 114 extend circumferentially from the vertically extending slots 112 and the flanges 302 slide in the grooves 114 when the first plate 300 is rotated with respect to the electrode carrier 100. Once the first plate 300 is installed on the electrode carrier 100 by the flanges 302 rotated in the grooves 114, thumbscrews 304 on the first plate 300 can be screwed into threaded openings 180 in the aluminum plate 176 of the composite showerhead electrode 170. FIG. 6 shows a detailed view of the first plate 300 secured to the aluminum plate 176 secured to the electrode carrier 100. With the composite showerhead electrode 170 secured to the electrode carrier 100, the electrode carrier 100 can be manually lifted off of the acid treatment stand 200 by the handles 116, turned over so that the silicon electrode face 172 of the composite showerhead electrode 170 is facing downward, and replaced on the acid treatment stand 200 with the tips of the posts 206 inserted in the electrode carrier holes 103.

Figure 7:
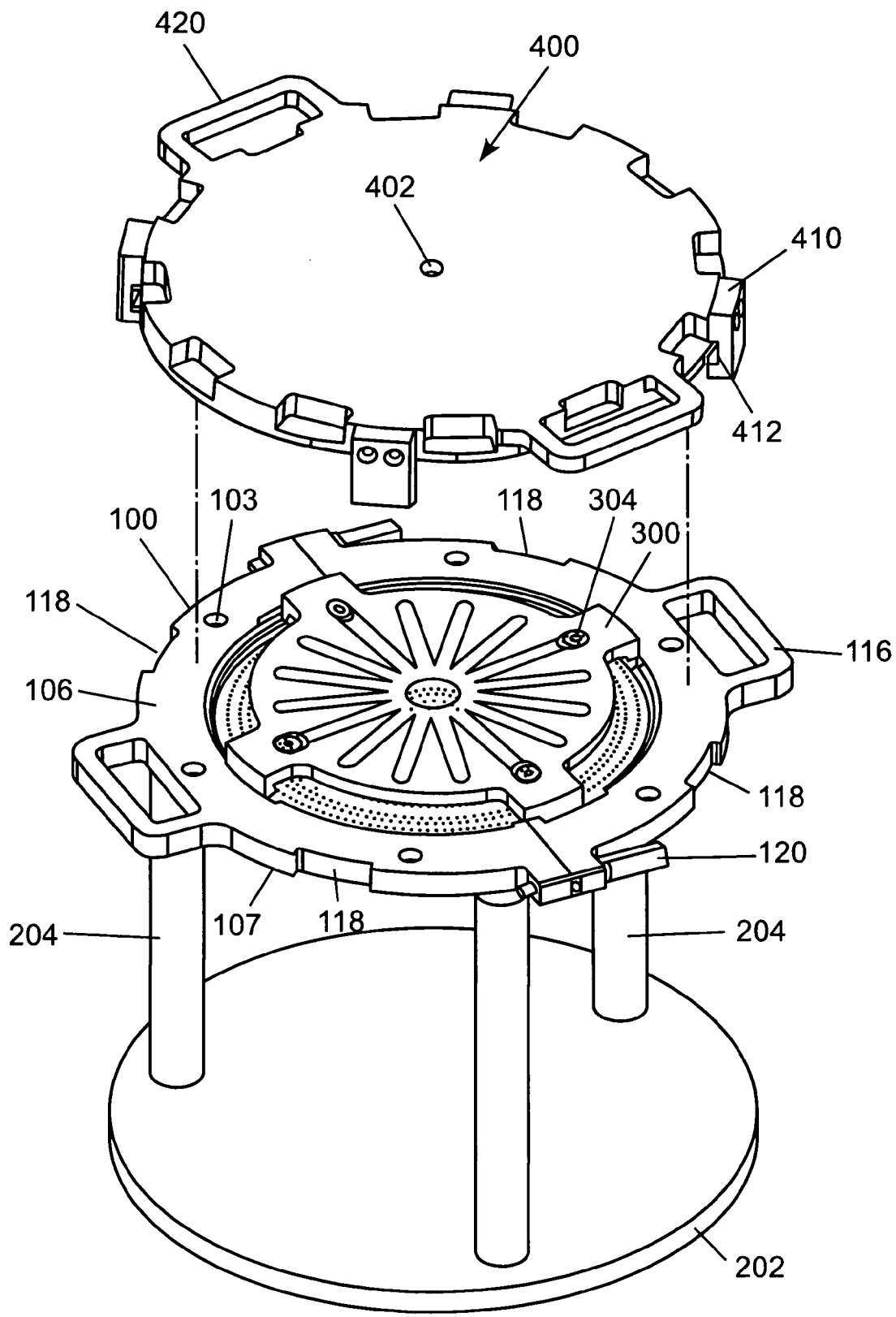
FIG. 7 shows the electrode carrier of FIG. 1 with the installed spider plate of FIG. 4 facing away from the treatment stand and a nitrogen gas purge plate.
Figure 8:
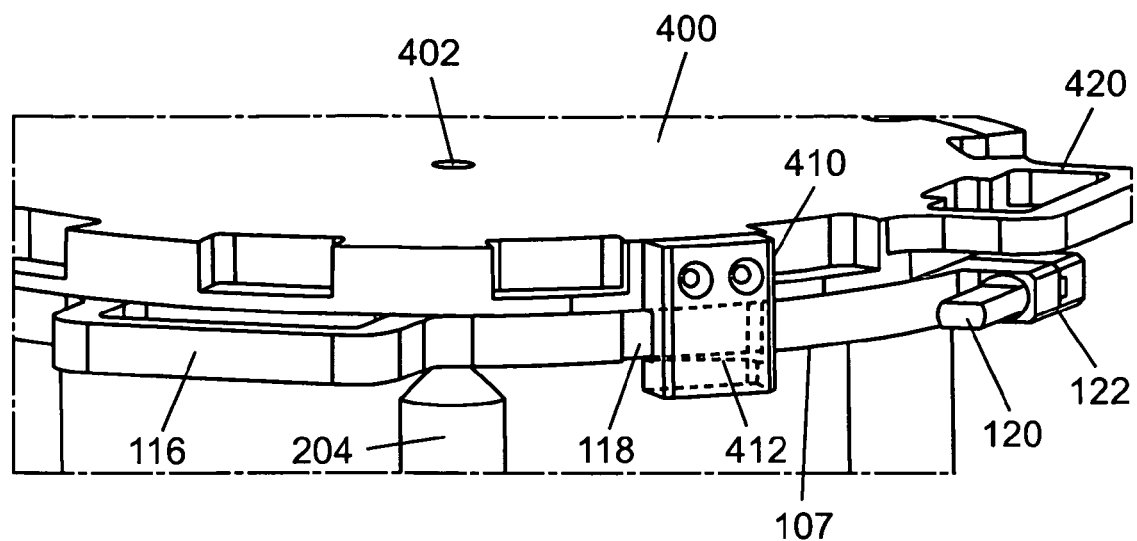
FIG. 8 shows details of the purge plate shown in FIG. 7 installed on the electrode carrier over the spider plate.

As shown in FIG. 7 the electrode carrier 100 on the acid treatment stand posts 204 allows the silicon surface of the electrode assembly 172 (See FIG. 1) to be supported facing downward to be acid cleaned by manual wiping. FIG. 7 shows installation of a second plate 400 ($N_2$ purge plate). The second plate 400 attaches to the electrode carrier second surface 107 and is sealed to the electrode carrier first surface 106 with an O-ring seal (not shown). The second plate 400 has vertically extending locking flanges 410 with circumferentially extending cam surfaces 412 at the lower ends of the locking flanges 410. The locking flanges 410 move vertically along vertically extending slots 118 on an outer periphery of the electrode carrier 100. The cam surfaces 412 engage the electrode carrier second surface 107 and compress the seal as the second plate 400 is rotated with respect to the electrode carrier 100. FIG. 8 shows a detailed view of a cam surface 412 on the locking flanges 410 of the second plate 400 attached to the electrode carrier 100 and covering the first plate 300.

Nitrogen gas ($N_2$) can be introduced under pressure through the gas inlet 402 in the second plate 400 to flow into gas holes 178 in the aluminum plate 176 and exit corresponding holes 174 in the silicon plate 172. The second plate 400 thus allows gas to be flowed through the gas holes 174, 178 during acid cleaning of the exposed surface of the silicon plate 172 preventing acid from seeping into the gas holes 174, 178.

Figure 9:
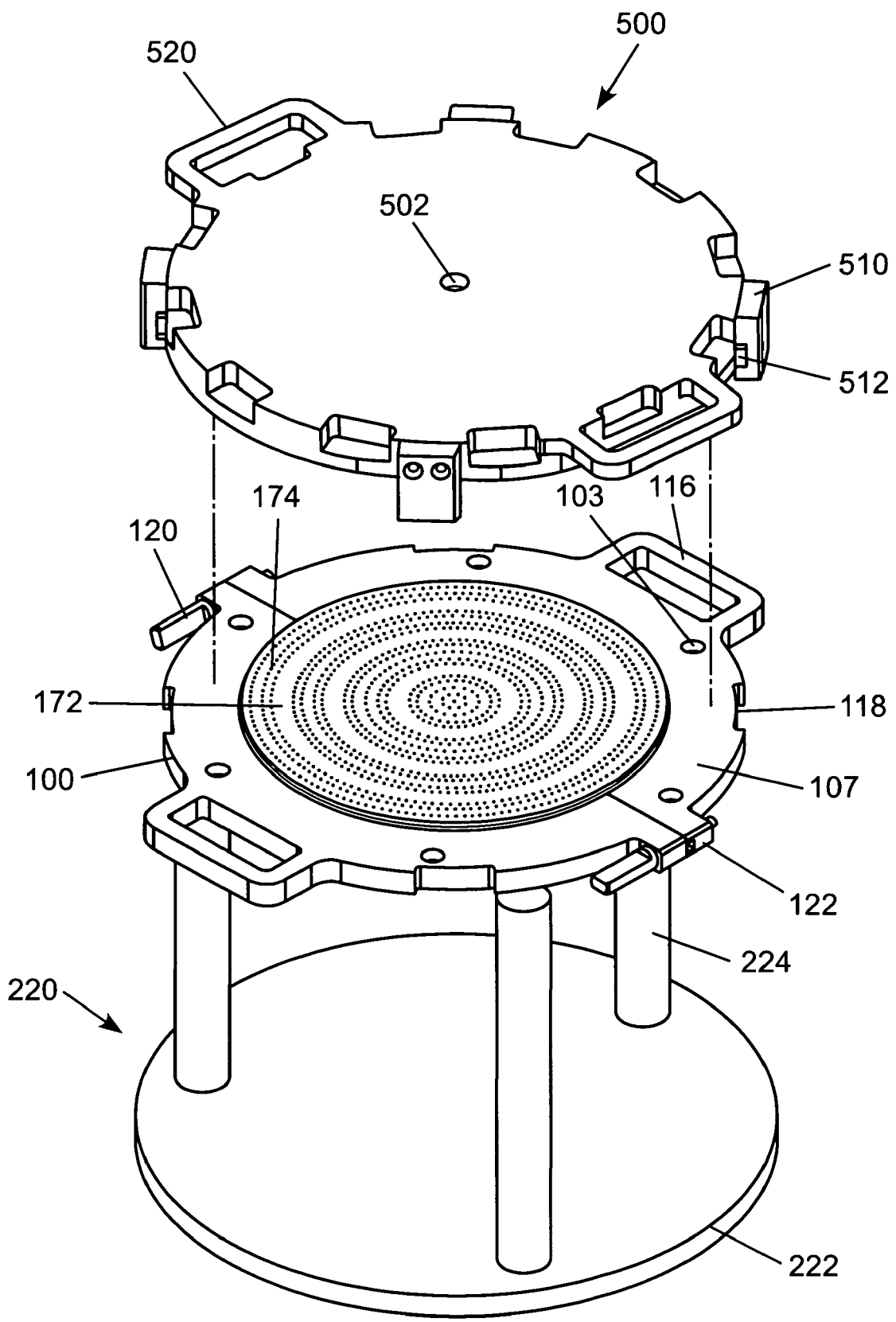
FIG. 9 shows the electrode carrier, electrode, and treatment stand of FIG. 3, the spider plate installation side of the electrode carrier facing the treatment stand and an embodiment of a water rinse plate.

Following a series of acid washes and rinsing of the silicon plate 172 from the bottom while $N_2$ is flowed through the gas holes 174, 178 the second plate 400 is removed and the electrode carrier 100 can be manually removed from the acid treatment stand posts 204 of the acid treatment stand 200 by the handles 116, turned over so that the silicon electrode face 172 of the composite showerhead electrode 170 is facing upward, and replaced on the acid treatment stand 200 with the tips of the posts 206 inserted in the electrode carrier holes 103 (or placed on tips of posts 224 of another treatment stand 220 having a generally flat base 222). The first plate 300 can then be removed and the composite showerhead electrode 170 will rest on inwardly extending projections 110 (shown in FIGS. 2A and 2B). As shown in FIG. 9, the electrode carrier 100 on the treatment stand posts 224 allows the silicon surface of the electrode assembly 172 to be supported facing upward to be rinsed. FIG. 9 shows installation of a third plate 500 (water rinse plate). The third plate 500 attaches to the electrode carrier first surface 106 and is sealed to the electrode carrier second surface 107 with an O-ring seal (not shown). The third plate 500 has vertically extending locking flanges 510 with circumferentially extending cam surfaces 512 at the lower ends of the locking flanges 510. The locking flanges 510 move vertically along vertically extending slots 118 on an outer periphery of the electrode carrier 100. The cam surfaces 512 engage the electrode carrier first surface 106 and compress the seal as the third plate 500 is rotated with respect to the electrode carrier 100.

Water can be introduced under low pressure through the water inlet 502 in the third plate 500 to flow into gas holes 174 in the silicon plate 172 and exit corresponding holes 178 in the aluminum plate 176. The third plate 500 thus allows water to be flowed through the gas holes 174, 178 during flushing with water of the cleaned surface of the silicon plate 172 preventing particles from the backing plate 176 from contaminating the cleaned silicon plate 172. After the water rinse the third plate 500 can be removed.

Figure 10:
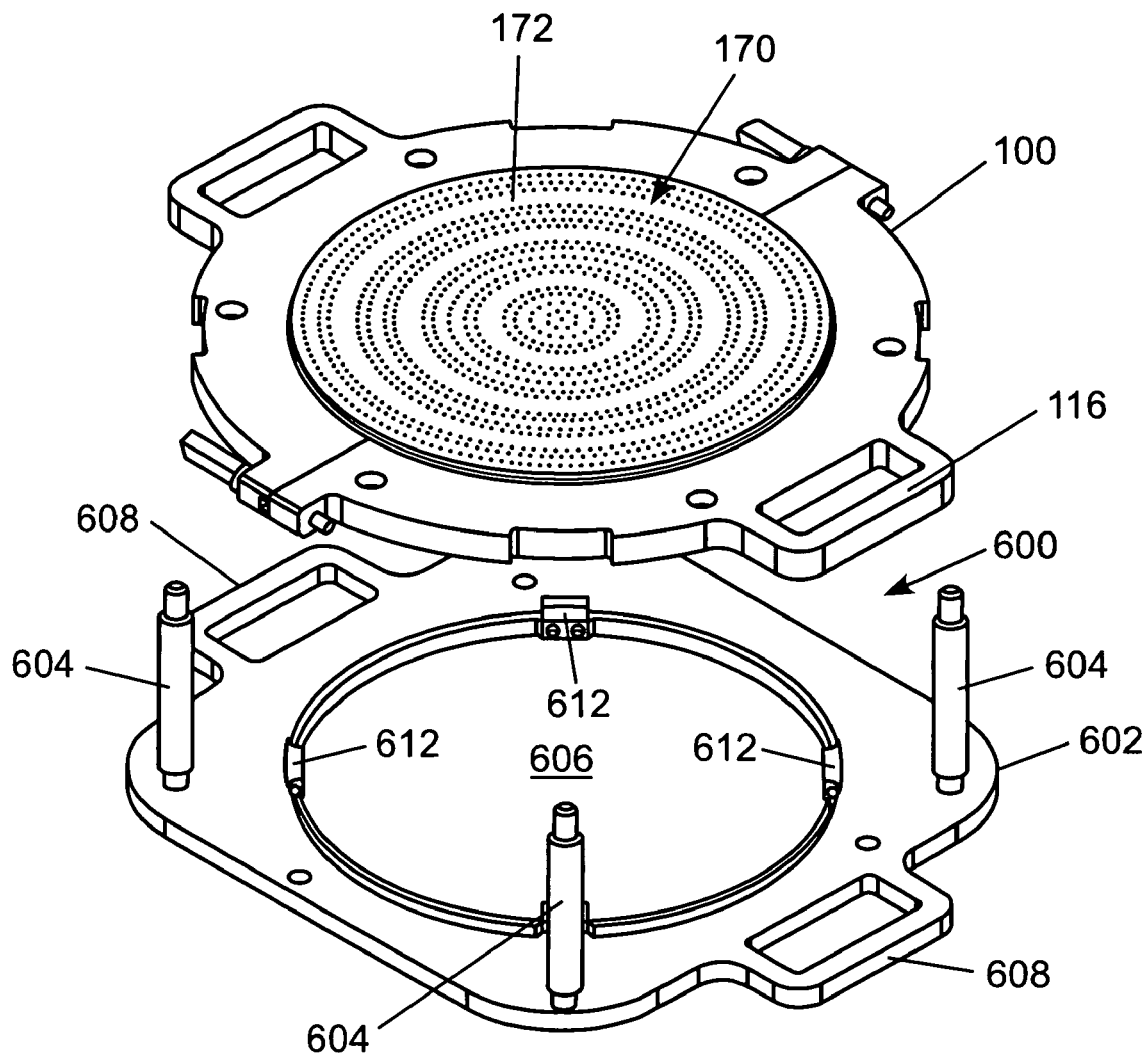
FIG. 10 shows the electrode carrier and electrode of FIG. 1 and an embodiment of a drying stand.
Figure 11:
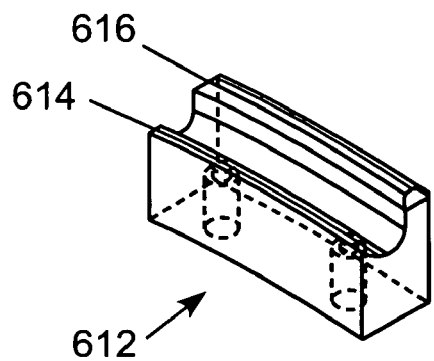
FIG. 11 shows a detailed view of rail supports shown in FIG. 10.

FIG. 10 shows the electrode 170 supported in the electrode carrier 100 prior to being lowered onto a drying stand 600 with the silicon plate facing upward. The drying stand 600 comprises a base frame 602, vertical posts 604, a center opening 606 approximately the size of the composite showerhead electrode 170, and a number of support members 612 which extend vertically above an upper surface of the base frame 602 to support the aluminum plate 176. The base plate 602 may include handles 608 to manually manipulate the drying stand 600. The support posts 604 and the electrode carrier 100 are configured to allow removal of the electrode carrier 100 from the composite showerhead electrode 170 without manually touching the electrode 100. As shown in FIG. 11, each support member 612 supports the aluminum plate 176 along a line contact 614 to avoid water trapping and water staining of the aluminum plate 176. The support members 612 include vertical fingers 616 to prevent lateral movement of the electrode plate 170. In an embodiment, the support members may be made from a chemically resistant material, such as PEEK.

Figure 12:
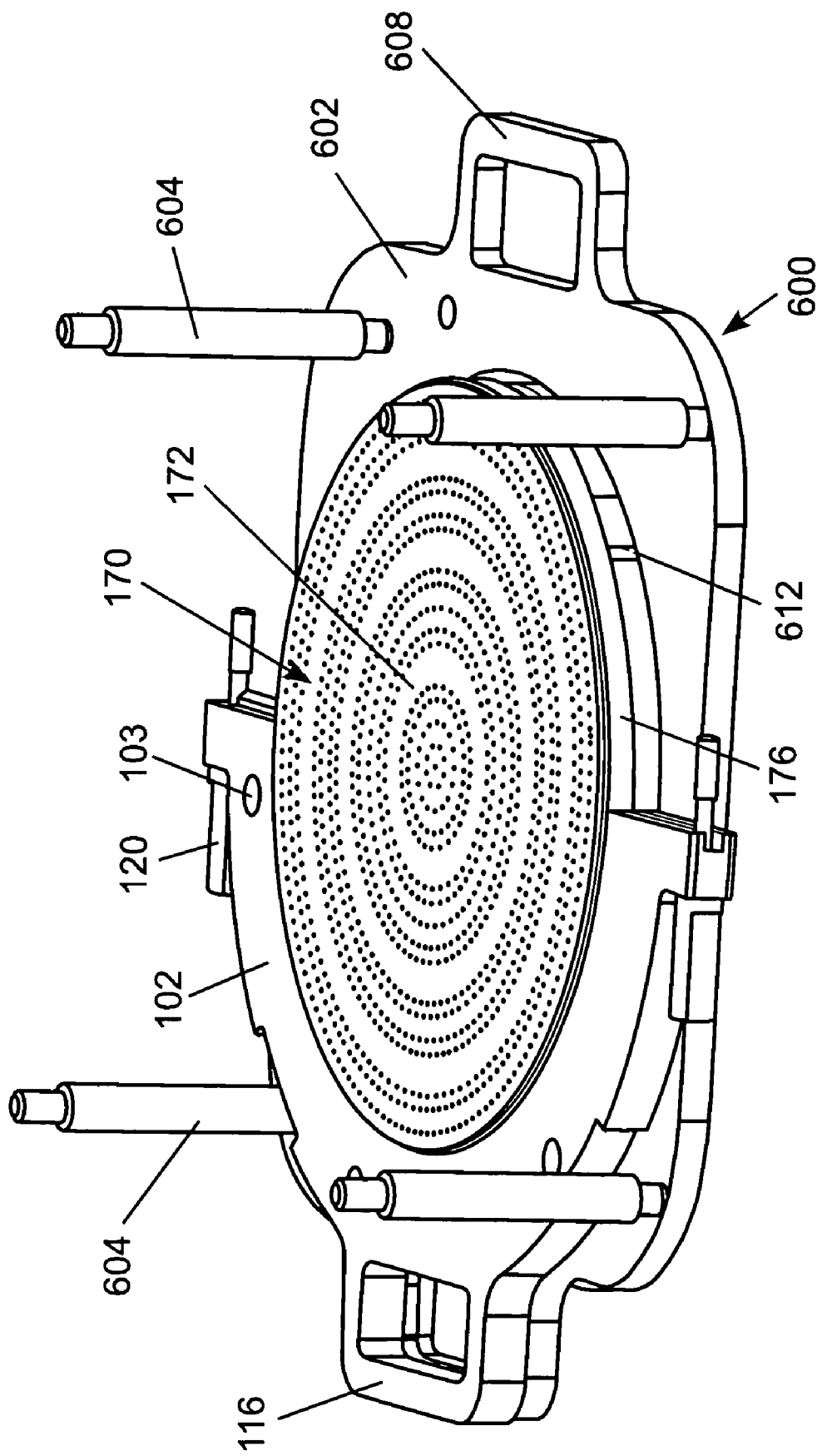
FIG. 12 shows the electrode carrier of FIG. 10 partially removed and the electrode resting on the rail supports of the drying stand.

With the aluminum plate 176 supported by the support members 612 the first and second halves 101 and 102 of the electrode carrier 100 are movable horizontally away from each other and detachable from the composite showerhead electrode 170. FIG. 12 shows the composite showerhead electrode 170 supported on the support members 612 of the drying stand 600 with one half of the electrode carrier 101 which surrounded half of the periphery of the composite showerhead electrode 170 removed. The other half of the electrode carrier 102 is shown surrounding the other half of the periphery of the composite showerhead electrode 170 prior to removal.

Figure 13:
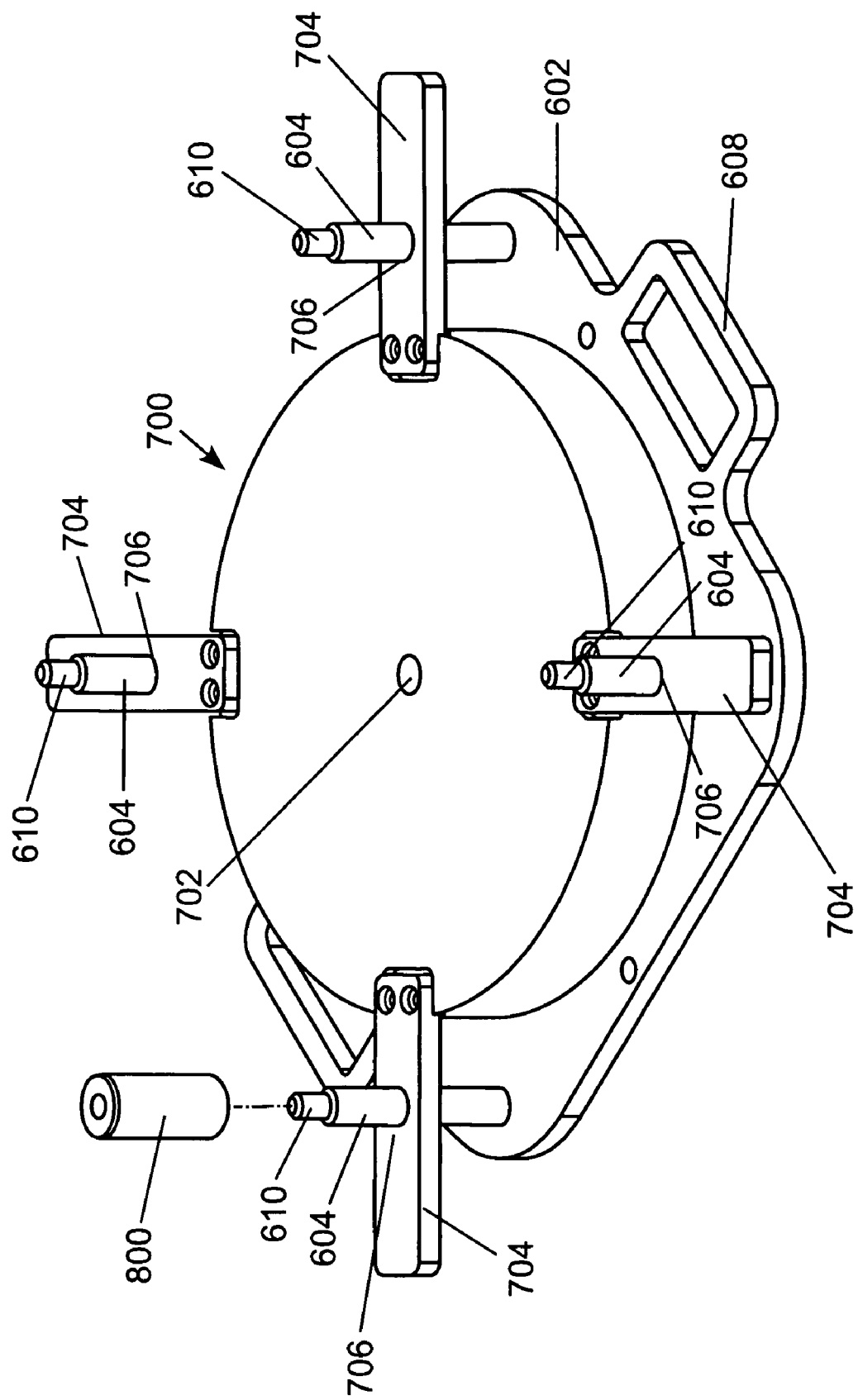
FIG. 13 shows an embodiment of a nitrogen gas blow dry plate installed over the electrode on the drying stand of FIG. 12.

FIG. 13 shows a fourth plate 700 (blow dry plate) sealed to the base frame 602 over the composite showerhead electrode 170 after the electrode carrier 100 is removed. The drying stand posts 604 have threaded rods 610 at their tips. The fourth plate 700 includes arms 704 with openings 706. The openings 706 slide along the posts 604 and hand nuts 800 engage the threaded rods 610 to compress the arms 704 downward to seal an O-ring on the fourth plate 700 against the base frame 602. The fourth plate 700 includes a gas inlet 702. Gas can be introduced under pressure through the gas inlet 702 to flow into the silicon plate gas holes 174 and out of the corresponding aluminum plate gas holes 178 as well as around the periphery of the composite showerhead electrode 170 to blow dry the electrode 170 with, for example, nitrogen gas ($N_2$). After the gas blow dry, the fourth plate 700 can be removed and the composite showerhead electrode 170 supported on the drying stand 600 can be placed in an oven to bake. By manually contacting the handles 608, the composite showerhead electrode 170 can be removed from the oven after the bake, cooled and bagged without direct human contact with the composite showerhead electrode 170. A spatula may be used to transfer the composite showerhead electrode 170 from the drying stand 600 to the bag.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A cleaning kit useful for cleaning composite showerhead electrode of a plasma reaction chamber wherein the composite showerhead electrode includes a silicon plate bonded to an aluminum backing plate, the kit comprising:

an electrode carrier which supports the composite showerhead electrode with the silicon plate facing up;

a treatment stand having a base and a plurality of support posts which engage the electrode carrier and support the electrode carrier;

a first plate which attaches to a first side of the electrode carrier and one or more attachment members which engage the aluminum plate to support the composite showerhead electrode with the silicon plate exposed for cleaning thereof;

a second plate which attaches to the first side of the electrode carrier such that the first plate is located in a space between the second plate and the composite showerhead electrode, the second plate including a seal which engages the first side of the electrode carrier and a gas inlet through which gas can be introduced under pressure to flow into gas holes in the aluminum plate and exit corresponding gas holes in the silicon plate, the second plate allowing gas to be flowed through the gas holes during acid cleaning of the exposed surface of the silicon plate;

a third plate which attaches to the second side of the electrode carrier with the silicon plate facing up, the third plate including a seal which engages the electrode carrier and a water inlet through which water can be introduced under pressure to flow into gas holes in the silicon plate and exit corresponding gas holes in the aluminum plate, the third plate allowing low pressure water to be flushed through the gas holes for water rinsing the composite showerhead electrode after the cleaning the silicon surface;

a drying stand having a base frame and a plurality of posts, the base frame supporting the electrode carrier and the composite showerhead electrode such that the electrode carrier can be removed from the composite showerhead electrode without manually touching the composite showerhead electrode;

a fourth plate including a seal which engages the base frame and a gas inlet through which gas can be introduced under pressure to flow into gas holes in the silicon plate and exit corresponding gas holes in the aluminum plate, the fourth plate allowing gas to dry the composite showerhead electrode after a water rinsing step.

2. The kit of claim 1, wherein the electrode carrier comprises first and second parts which are attached together by at least one fastener, the first and second parts including an inner periphery which fits around an outside of the composite showerhead electrode and one or more inwardly extending projections which engage the exposed surface of the aluminum plate.

3. The kit of claim 2, wherein the first part includes an outwardly extending boss, a horizontally extending opening in the boss and a thumbscrew supported in the opening, the second part includes an outwardly extending boss with a threaded opening therein which receives the thumbscrew to secure the first and second parts together, the electrode carrier including opposed handles to allow manual lifting of the electrode carrier with the composite showerhead electrode supported thereon, the one or more projections comprise three projections on the first part and three projections on the second part, the treatment stand including three posts, and the electrode carrier including at least three holes on each side of the electrode carrier configured to receive tips of the three posts of the treatment stand.

4. The kit of claim 1, wherein the electrode carrier includes a plurality of vertically extending slots on an inner periphery thereof communicating with circumferentially extending grooves and the first plate includes a plurality of flanges configured to move vertically within the slots and slide in the grooves when the first plate is rotated with respect to the electrode carrier, the one or more attachment members comprising thumbscrews which can be screwed into threaded openings in the aluminum plate.

5. The kit of claim 4, wherein the first plate includes four flanges and four thumbscrews.

6. The kit of claim 1, wherein the second plate includes a plurality of vertically extending locking flanges with circumferentially extending cam surfaces at lower ends thereof, the electrode carrier includes a plurality of vertically extending slots on an outer periphery thereof, the locking flanges configured to move vertically along the slots and the cam surfaces configured to engage the second side of the electrode carrier and compress the seal as the second plate is rotated with respect to the electrode carrier.

7. The kit of claim 6, wherein the second plate includes a pair of handles extending outwardly thereof on opposite sides of the second plate.

8. The kit of claim 1, wherein the third plate includes a plurality of vertically extending locking flanges with circumferentially extending cam surfaces at lower ends thereof, the electrode carrier includes a plurality of vertically extending slots on an outer periphery thereof, the locking flanges configured to move vertically along the slots and the cam surfaces configured to engage the first side of the electrode carrier and compress the seal as the third plate is rotated with respect to the electrode carrier.

9. The kit of claim 1, wherein the base frame includes four posts having threaded rods at the tips thereof and the fourth plate includes four arms with openings therethrough, the openings in the arms sliding along the posts, the kit including four hand nuts which engage the threaded rods so as to compress the arms downwardly to seal the fourth plate against the base frame.

10. The kit of claim 9, wherein the base frame includes a center opening approximating the size of the composite showerhead electrode and a plurality of support members which extend vertically above an upper surface of the base frame to engage the aluminum plate, the support posts and electrode carrier being configured to allow removal of the electrode carrier from the composite showerhead electrode.

11. The kit of claim 10, wherein the electrode carrier comprises first and second parts each of which surrounds half of the periphery of the composite showerhead electrode, the first and second parts being movable horizontally away from each other and detachable from the composite showerhead electrode while the composite showerhead electrode is supported on the base frame.

12. A method of cleaning a composite showerhead electrode of a plasma reaction chamber wherein the composite showerhead electrode includes a silicon plate bonded to an aluminum backing plate, the method comprising:

supporting the composite showerhead electrode with an electrode carrier which supports the composite showerhead electrode with the silicon plate facing up;

supporting the electrode carrier on a treatment stand having a base and a plurality of support posts which engage holes in the electrode carrier;

attaching a first plate to a first side of the electrode carrier and attaching one or more attachment members to the aluminum plate to support the composite showerhead electrode in the electrode carrier with the silicon plate exposed for cleaning thereof;

removing the electrode carrier from the treatment stand, turning the electrode over and placing the electrode carrier on the treatment stand with the silicon plate facing down;

attaching a second plate to the electrode carrier such that the first plate is located in a space between the second plate and the composite showerhead electrode, the second plate including a seal which engages the first side of the electrode carrier and a gas inlet through which gas can be introduced under pressure to flow into gas holes in the aluminum plate and exit corresponding gas holes in the silicon plate;

attaching a gas source to the gas inlet in the second plate and flowing gas through the gas holes while acid cleaning the exposed surface of the silicon plate;

removing the electrode carrier from the treatment stand, turning the electrode carrier over and placing the electrode carrier on the treatment stand with the silicon plate facing up;

removing the first and second plates and attaching a third plate to the second side of the electrode carrier with the silicon plate facing up, the third plate including a seal which engages the electrode carrier and a water inlet through which water can be introduced under pressure to flow water into gas holes in the silicon plate and exit corresponding gas holes in the aluminum plate;

attaching a water source to the water inlet of the third plate and flushing water through the gas holes so as to water rinse the composite showerhead electrode after acid cleaning the silicon surface;

removing the third plate and placing the electrode carrier on a base frame of a drying stand having a plurality of posts;

removing the electrode carrier from the composite showerhead electrode without manually touching the electrode carrier;

attaching a fourth plate to the drying stand by sliding the fourth plate over the posts and forming a seal between the base frame and the fourth plate, the fourth plate including a gas inlet through which gas can be introduced under pressure to flow into gas holes in the silicon plate and exit corresponding gas holes in the aluminum plate;

attaching a gas source to the gas inlet of the fourth plate and blowing gas over the composite showerhead electrode to dry the composite showerhead electrode after a water rinsing step;

removing the fourth plate and placing the composite showerhead electrode in an oven while the composite showerhead electrode is supported on the base frame of the drying stand.

13. The method of claim 12, wherein the electrode carrier is attached to the composite showerhead electrode by attaching first and second parts of the electrode carrier together by at least one fastener, the first and second parts including an inner periphery which fits around an outside of the composite showerhead electrode and one or more inwardly extending projections which engage the exposed surface of the aluminum plate.

14. The method of claim 13, wherein the first part includes an outwardly extending boss, a horizontally extending opening in the boss and a thumbscrew supported in the opening, the second part includes an outwardly extending boss with a threaded opening therein, the electrode carrier being attached by engaging the thumbscrew with the opening to secure the first and second parts together, the electrode carrier including opposed handles to allow manual lifting of the electrode carrier with the composite showerhead electrode supported thereon, the placing of the electrode carrier on the treatment stand being carried out by manually lifting the electrode carrier by the handles.

15. The method of claim 12, wherein the electrode carrier includes a plurality of vertically extending slots on an inner periphery thereof communicating with circumferentially extending grooves, the first plate being attached by moving the first plate vertically to insert a plurality of flanges on the first plate within the slots in the electrode carrier and rotating the first plate to slide outwardly extending projections on the flanges in the grooves, the first plate being attached to the aluminum plate by rotating thumbscrews supported on the first plate into threaded openings in the aluminum plate.

16. The method of claim 12, wherein the second plate includes a plurality of vertically extending locking flanges with circumferentially extending cam surfaces at lower ends thereof, the electrode carrier includes a plurality of vertically extending slots on an outer periphery thereof, the second plate being attached to the electrode carrier by moving the locking flanges vertically along the slots and rotating the second plate such that the cam surfaces engage an underside of the electrode carrier and compress the seal.

17. The method of claim 12, wherein the third plate includes a plurality of vertically extending locking flanges with circumferentially extending cam surfaces at lower ends thereof, the electrode carrier includes a plurality of vertically extending slots on an outer periphery thereof, the third plate being attached to the electrode carrier by vertically moving the locking flanges along the slots and rotating the third plate such that the cam surfaces engage an underside of the electrode carrier and compress the seal.

18. The method of claim 12, wherein the base frame includes four posts having threaded rods at the tips thereof and the fourth plate includes four arms with openings therethrough, the openings in the arms sliding along the posts, the fourth plate being attached to the base frame by rotating four hand nuts which engage the threaded rods so as to compress the arms downwardly to seal the fourth plate against the base frame.

19. The method of claim 18, wherein the base frame includes a center opening approximating the size of the composite showerhead electrode and a plurality of support members which extend vertically above an upper surface of the base frame and engage the silicon plate, the electrode carrier being removed by detaching sliding first and second parts of the electrode carrier and sliding the first and second parts away from the electrode carrier.

20. The method of claim 19, wherein the first and second parts are moved horizontally away from each other and detached from the composite showerhead electrode while the silicon plate of the composite showerhead electrode is supported on the base frame.

* * * * *

UNITED STATES PATENT AND TRADEMARK OFFICE
Certificate

Patent No. 7,767,028 B2                                                                                           Patented: August 3, 2010

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jason Augustino, Fremont, CA (US); Armen Avoyan, Glendale, CA (US); Duane Outka, Fremont, CA (US); Stephen Whitten, Danville, CA (US); Hong Shih, Walnut, CA (US); and Yan Fang, Fremont, CA (US).

Signed and Sealed this Ninth Day of September 2014.

MICHAEL BARR
*Supervisory Patent Examiner*
Art Unit 1711
Technology Center 1700